(12) United States Patent
Takahashi

(10) Patent No.: US 7,335,090 B2
(45) Date of Patent: Feb. 26, 2008

(54) SUBSTRATE PROCESSING APPARATUS AND SUBSTRATE HANDLING METHOD

(75) Inventor: Hiroaki Takahashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/679,537

(22) Filed: Feb. 27, 2007

(65) Prior Publication Data

US 2007/0207706 A1    Sep. 6, 2007

(30) Foreign Application Priority Data

Mar. 1, 2006    (JP)    ............................. 2006-55135

(51) Int. Cl.
*B24B 1/00*    (2006.01)
(52) U.S. Cl. ..................... 451/41; 451/28; 451/331; 414/937; 414/941
(58) Field of Classification Search ............. 451/28, 451/41, 53, 54, 285, 287, 331; 414/935, 414/938, 940, 941
See application file for complete search history.

(56) References Cited

U.S. PATENT DOCUMENTS

| | | | |
|---|---|---|---|
| 5,477,083 A * | 12/1995 | Kawai | 257/701 |
| 5,679,055 A * | 10/1997 | Greene et al. | 451/10 |
| 6,135,854 A * | 10/2000 | Masumura et al. | 451/6 |
| 6,232,578 B1 * | 5/2001 | Klebanoff et al. | 219/228 |
| 6,796,881 B1 * | 9/2004 | Vogtmann et al. | 451/8 |
| 2002/0135966 A1 * | 9/2002 | Tanaka et al. | 361/212 |
| 2003/0211812 A1 * | 11/2003 | Isobe et al. | 451/5 |
| 2005/0115671 A1 | 6/2005 | Araki | |
| 2006/0081968 A1 * | 4/2006 | Bai et al. | 257/678 |
| 2006/0175016 A1 * | 8/2006 | Edamura et al. | 156/345.48 |
| 2006/0292967 A1 * | 12/2006 | Torii et al. | 451/11 |

* cited by examiner

*Primary Examiner*—Eileen P. Morgan
(74) *Attorney, Agent, or Firm*—Ostrolenk, Faber, Gerb & Soffen, LLP

(57) ABSTRACT

A substrate processing apparatus includes: a carrier holding unit for holding a carrier which houses a substrate; a substrate holding mechanism for holding a substrate when a predetermined process is executed on the substrate; and a substrate transfer mechanism for transferring a substrate between the substrate holding mechanism and the carrier held by the carrier holding unit. The substrate holding mechanism has a first substrate contacting member which comes in contact with the substrate when the substrate holding mechanism holds the substrate, and at least the substrate contacting portion of the first substrate contacting member includes a conductive portion, which is electrically grounded. The substrate transfer mechanism has a second substrate contacting member which comes in contact with the substrate when the substrate transfer mechanism transfers the substrate, and at least the substrate contacting portion of the second substrate contacting member includes a conductive portion, which is electrically grounded.

5 Claims, 3 Drawing Sheets

SUBSTRATE PROCESSING APPARATUS AND SUBSTRATE HANDLING METHOD

BACKGROUND OF THE INVENTION

1. Field of the Invention

The present invention relates to a substrate processing apparatus for executing processing on a substrate and to a method for handling a substrate while restraining the substrate from being electrically charged. Examples of the substrate to be processed or handled include a semiconductor wafer, a liquid crystal display substrate, a plasma-display substrate, an FED (Field Emission Display) substrate, an optical-disk substrate, a magnetic-disk substrate, a magneto-optical-disk substrate, a photomask substrate and the like.

2. Description of Related Art

In a semiconductor device manufacturing process, a single-substrate-processing-type cleaning apparatus is used for cleaning the surface of a semiconductor substrate (wafer) Such a substrate cleaning apparatus has: a carrier holding unit for holding a carrier which houses a plurality of substrates; an indexer robot for carrying a substrate in and out from the carrier held by the carrier holding unit; a substrate processing unit for processing a substrate using a treatment liquid or the like; and a main transfer robot for transferring a substrate between the indexer robot and the substrate processing unit.

The substrate processing unit has, for example, a spin chuck for rotating a substrate as held substantially horizontal, and a treatment liquid nozzle for supplying a treatment liquid (a chemical or a rinse agent) to the surface of a substrate held by the spin chuck, these spin chuck and the nozzle housed in a processing chamber.

In the component elements housed in the processing chamber, a resin material such as PTFE (polytetrafluoroethylene resin), or PCTFE (polychlorotrifluoroethylene resin) is frequently used in view of resistance to chemical. The members made of such resin material are readily electrically charged. Accordingly, when a substrate is carried in the space in the processing chamber, the substrate is electrically induced and charged, causing the substrate to present a high potential. Therefore, when a treatment liquid is supplied to the surface of a substrate held by the spin chuck, electrical discharge is induced immediately before the treatment liquid reaches thereto. This disadvantageously breaks down the film formed on the substrate surface or devices formed in the substrate. Further, when a processed substrate is carried out from the processing chamber, the substrate is electrically induced and charged again. Thereafter, when the substrate comes in contact with a member which is electrically grounded, this induces electrical discharge.

SUMMARY OF THE INVENTION

It is an object of the present invention to provide a substrate processing apparatus having an arrangement capable of restraining or preventing a substrate from being electrically induced and charged.

It is another object of the present invention to provide a substrate handling method capable of restraining or preventing a substrate from being electrically induced and charged in a substrate processing apparatus.

A substrate processing apparatus according to the present invention comprises: a carrier holding unit (2) for holding a carrier (C) which houses substrates (W); a substrate holding mechanism (51) for holding a substrate at the time when a predetermined process is executed on the substrate; and a substrate transfer mechanism (6, 30) for transferring a substrate between the substrate holding mechanism and the carrier held by the carrier holding unit. The substrate holding mechanism has a first substrate contacting member (82) which comes in contact with a substrate at the time when the substrate holding mechanism holds the substrate, and at least the substrate contacting portion (82a, 82b) of the first substrate contacting member includes a conductive portion, which is electrically grounded. The substrate transfer mechanism has a second substrate contacting member (21, 22, 31, 32) which comes in contact with a substrate at the time when the substrate transfer mechanism transfers the substrate, and at least the substrate contacting portion (21a, 22a, 31a, 32a) of the second substrate contacting member includes a conductive portion, which is electrically grounded.

In this section, SUMMARY OF THE INVENTION, the alphanumeric characters in parentheses represent the corresponding component elements and the like in the embodiments to be discussed later. However, this does not mean that the present invention is construed only to these embodiments.

According to the above-mentioned arrangement, a substrate can be grounded through the conductive portions during the whole substrate transfer process between the carrier and the substrate holding mechanism. Accordingly, even though the substrate holding mechanism is surrounded by the members made of resin, it is possible to restrain or prevent the substrate from being electrically induced and charged. This restrains or prevents breakdown of the substrate due to electrical discharge (more specifically, breakdown of the thin films or devices formed on the substrate).

The substrate transfer mechanism may comprise a first transfer mechanism (6) for carrying a substrate in and/or out from the carrier held by the carrier holding unit, and a second transfer mechanism (30) for transferring a substrate between the first transfer mechanism and the substrate holding mechanism. It is preferable that each of the first and second transfer mechanisms has the second substrate contacting member which comes in contact with a substrate at the time when each of the first and second transfer mechanisms holds the substrate.

According to the above-mentioned arrangement, each of the first transfer mechanism to access the carrier and the second transfer mechanism to access the substrate holding mechanism is arranged to electrically ground a substrate through the conductive portion. Accordingly, even though the substrate transfer mechanism has two transfer mechanisms respectively having different functions, it is possible to restrain or prevent the substrate from being electrically induced and charged.

Preferably, there is further provided a third substrate contacting member (20) which comes in contact with the substrates housed in the carrier held by the carrier holding unit. It is preferable that at least a substrate contacting portion of the third substrate contacting member includes a conductive portion, and that this conductive portion is electrically grounded.

According to the above-mentioned arrangement, a substrate can be grounded through the conductive portion also in the carrier held by the carrier holding unit. This effectively restrains or prevents the substrate from being electrically induced and charged in any position between the carrier and the substrate holding mechanism.

A substrate handling method according to the present invention comprises: a step of causing a carrier (C) which houses a substrate (W) held by a carrier holding unit (2); a substrate holding step of holding a substrate by a substrate holding mechanism (51) at the time when a predetermined process is executed on the substrate; a substrate transfer step of transferring a substrate between the substrate holding mechanism and the carrier held by the carrier holding unit; and a charging restraining step of contacting an electrically grounded conductive member (82, 21a, 22a, 31a, 32a) with the substrate during the whole period of time of the substrate holding step and the substrate transfer step, thereby to restrain the substrate from being electrically charged.

Preferably, the charging restraining step includes a step of contacting an electrically grounded conductive portion (20) with the substrates in the carrier held by the carrier holding unit.

The foregoing and other objects, features, and effects of the present invention will become more apparent from the following detailed description of the preferred embodiments with reference to the attached drawings.

DESCRIPTION OF THE PREFERRED EMBODIMENTS

Figure 1:
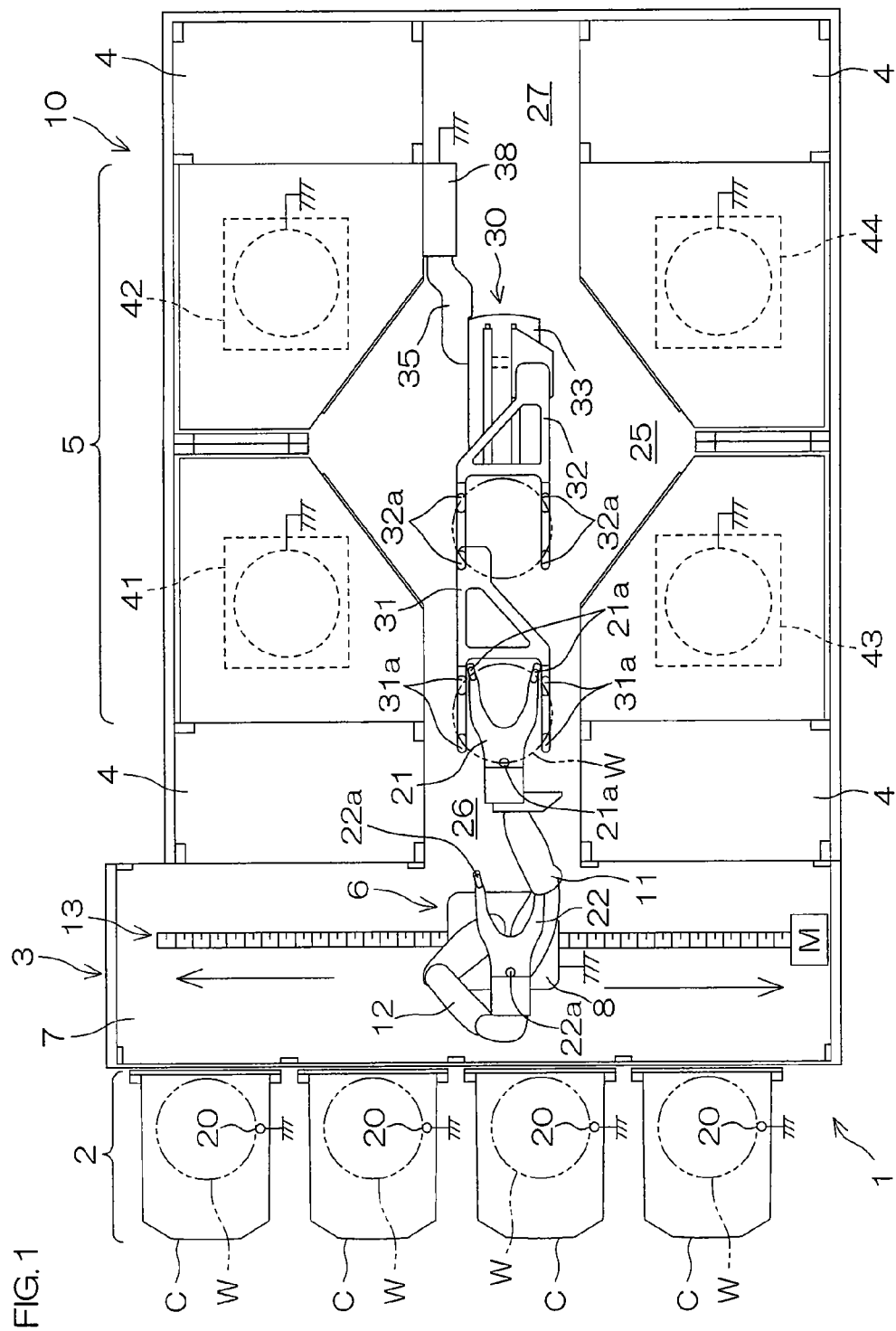
FIG. 1 is a schematic plan view for illustrating the arrangement of a substrate processing apparatus according to an embodiment of the present invention.

FIG. 1 is a schematic plan view for illustrating the arrangement of a substrate processing apparatus according to an embodiment of the present invention. The substrate processing apparatus 1 has an indexer unit 3 having a carrier holding unit 2, and a main body 10 coupled to the indexer unit 3. The main body 10 has a processing unit 5, liquid boxes 4 disposed between the processing unit 5 and the indexer unit 3, and further liquid boxes 4 disposed at the side of the processing unit 5 remote from the indexer unit 3.

The carrier holding unit 2 is arranged to hold a plurality of (four in the embodiment) carriers C. In each carrier C, a plurality of substrates W can be housed in lamination, as separated from one another at predetermined spatial intervals, and unprocessed substrates W or processed substrates W are to be housed.

In FIG. 1, there is used an FOUP (Front Opening Unified Pod) as the carrier C which houses substrates W as hermetically sealed. However, a carrier of the type such as an SMIF (Standard Mechanical Interface) pod, an OC (Open Cassette) or the like may also be used.

The indexer unit 3 is provided with an indexer robot 6 (first transfer mechanism) for carrying a substrate W in and out from the carrier C. The indexer robot 6 is arranged to travel in a transfer passage 7 along the array direction of a plurality of carriers C. More specifically, the indexer robot 6 has a base unit 8 and polyarticular-type first and second robot arms 11, 12 disposed on the base unit 8. The base unit 8 is arranged movable along the array direction of the carriers C by a ball screw mechanism 13. The base unit 8 is provided with a rotation driving mechanism (not shown) for rotating the first and second robot arms 11, 12 around a perpendicular axis of rotation, and horizontal movement driving mechanisms (not shown) for bending and stretching the first and second robot arms 11, 12 respectively, for advancing and retreating substrate holding hands 21, 22 respectively disposed at the tips of the first and second robot arms 11, 12.

According to the above-mentioned arrangement, the indexer robot 6 can be moved to the position opposite to a carrier C, and can advance or retreat the substrate holding hands 21, 22 with respect to the carrier C, so that a substrate W is carried in or out from the carrier C.

The substrate holding hands 21, 22 are substrate contacting members which come in contact with a substrate W. In this embodiment, the substrate holding hands 21, 22 have, at their portions to come in contact with the substrate W, conductive substrate holding members 21a, 22a (conductive portions) made of a conductive PEEK (polyether ether ketone resin) which is an example of a conductive resin material. Other portions of the substrate holding hands 21, 22 are made of a metallic material. The first and second robot arms 11, 12 are made of a metallic link member, and the base unit 8 is made of a metallic case. The metallic case of the base unit 8 is electrically grounded. Accordingly, the conductive substrate holding members 21a, 22a are grounded through the substrate holding hands 21, 22, the first and second robot arms 11, 12, the base unit 8 and the like, and a substrate W held by the conductive substrate holding members 21a, 22a is maintained at ground potential. Accordingly, even though an electrically charged member is present around the substrate W to be transferred, no induction charging is produced.

The processing unit 5 has a main transfer robot 30 having a pivot axis at the center in plan elevation, and a plurality of (four in this embodiment) substrate processing units 41-44 disposed as surrounding the main transfer robot 30.

At the center of the processing unit 5, the substrate processing units 41-44 define a transfer chamber 25 which houses the main transfer robot 30. The transfer chamber 25 is a space in which a substrate W passes as transferred by the main transfer robot 30, and which secures an operational space (turning space and vertical movement space) for the main transfer robot 30. The transfer chamber 25 is formed to divide the substrate processing units into two portions, i.e., the substrate processing units 41,42 and the substrate processing units 43,44. Further, the liquid boxes 4 between the indexer unit 3 and the processing unit 5 are disposed to be spaced apart from each other so as to form a passage 26 in the vicinity of the center of the moving direction of the indexer robot 6. The passage 26 secures a space where a substrate W is delivered between the indexer robot 6 and the main transfer robot 30.

On the other hand, the liquid boxes 4 placed at the side of the processing unit 5 remote from the indexer unit 3 are also disposed to be spaced apart from each other so as to define a maintenance passage 27 at the position opposite to the passage 26. This maintenance passage 27 is utilized as a passage for performing maintenance on the substrate processing units 41-44 and the main transfer robot 30.

The main transfer robot 30 has: a turning base 33; a first substrate holding hand 31 and a second substrate holding hand 32 both disposed on the turning base 33; a rotation driving mechanism (not shown) for rotating the turning base 33 around a perpendicular axis of turn; a support arm 35 which supports the rotation driving mechanism to support indirectly the turning base 33; a vertical movement driving mechanism (not shown) for vertically moving the support arm 35 to vertically move the first and second substrate holding hands 31, 32; a robot body 38 incorporating the vertical movement driving mechanism; and a horizontal movement driving mechanism (not shown) incorporated in the turning base 33 for horizontally moving the first and second substrate holding hands 31, 32 independently from each other.

The first and second substrate holding hands 31, 32 can horizontally advance and retreat on the turning base 33. The axis of turn of the turning base 33 is a perpendicular axis passing the center of the space surrounded by the substrate processing units 41-44, and is fixed with respect to the main body 10 at the time of the substrate processing operation. That is, the main transfer robot 30 has no travel driving mechanism for horizontally moving the main transfer robot 30 in its entirety.

According to the arrangement above-mentioned, the main transfer robot 30 causes the first and second substrate holding hands 31, 32 to be opposite to any substrate processing unit 41-44, and then to be advanced to or retreated from the substrate processing unit. This enables a substrate to be carried in or out from the substrate processing unit. Further, the main transfer robot 30 can advance the first and second substrate holding hands 31, 32 toward the indexer unit 3 in the passage 26. In such a situation, the indexer robot 6 advances the first and second substrate holding hands 21, 22 toward the passage 26 to enable the substrate W to be delivered between the indexer robot 6 and the main transfer robot 30.

The substrate holding hands 31, 32 are substrate contacting members which come in contact with a substrate W. In this embodiment, the substrate holding hands 31, 32 have, at their portions coming in contact with a substrate W, conductive substrate holding members 31*a*, 32*a* (conductive portions) made of a conductive PEEK as an example of a conductive resin material, and other portions of the substrate holding hands 31, 32 are made of a metallic material. The turning base 33, the support arm 35, and the robot body 38 are formed by members made of a metallic material. The robot body 38 is electrically grounded. Accordingly, the conductive substrate holding members 31*a*, 32*a* are grounded through the substrate holding hands 31, 32, the turning base 33, the support arm 35, the robot body 38 and the like, and a substrate W held by the conductive substrate holding members 31*a*, 32*a* is maintained at grounding potential. Accordingly, even though an electrically charged member is present around a substrate W which is being transferred, the substrate W is not electrically induced and charged.

In this embodiment, each of the substrate processing units 41-44 is, for example, a single-substrate-processing unit, arranged to process substrates W one by one, which executes a surface treatment on a substrate by supplying a treatment liquid thereto.

Figure 2:
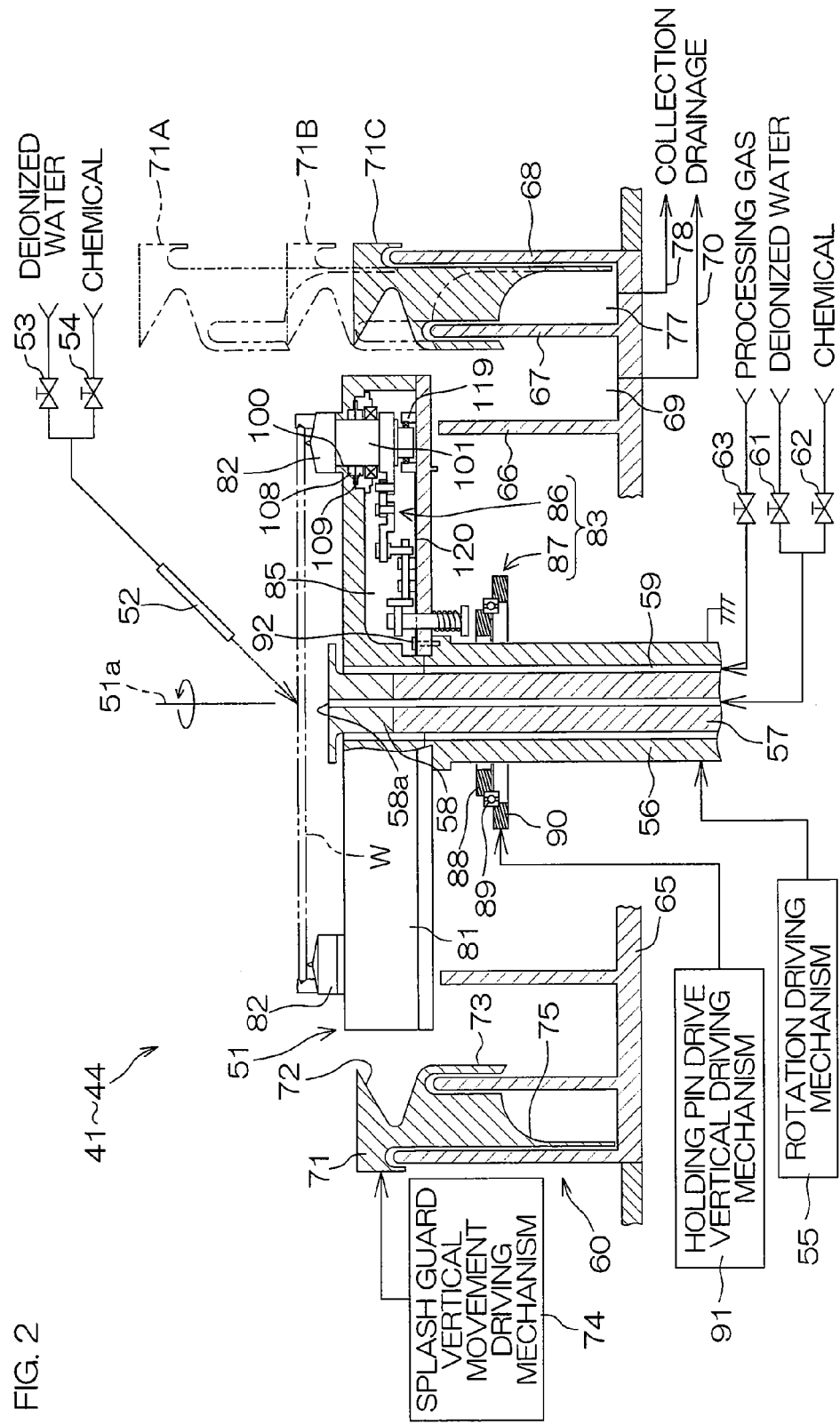
FIG. 2 is a schematic section view for illustrating an example of the arrangement of a substrate processing unit in the substrate processing apparatus shown in FIG. 1.

FIG. 2 is a schematic section view for illustrating the arrangement of the substrate processing unit 41-44. Each of the substrate processing units 41-44 has: a spin chuck 51 serving as a substrate holding and rotating mechanism which holds a substrate W (substantially circular substrate in this embodiment), for example, substantially horizontally, and which rotates the substrate W around a perpendicular axis of rotation 51*a* passing substantially the center of the substrate W thus held; and a treatment liquid nozzle 52 for supplying a treatment liquid onto the surface of a substrate W rotated as held by the spin chuck 51. Of course, provision may be made such that the substrate processing units 41-44 execute the same substrate processing or different substrate processing.

The spin chuck 51 is disposed inside of a processing cup 60. The treatment liquid nozzle 52 is disposed above the spin chuck 51 and arranged to supply a treatment liquid onto the top surface of a substrate W. Deionized water from a deionized water supply source can be supplied to the treatment liquid nozzle 52 through a deionized water valve 53, and a chemical (etching solution or the like) from a chemical supply source can be supplied to the treatment liquid nozzle 52 through a chemical valve 54. The treatment liquid nozzle 52 supplies a treatment liquid toward the center of rotation on the top surface of a substrate W. The treatment liquid subjected to a centrifugal force on the substrate W is spread toward the peripheral edge, causing the treatment liquid to spread to the entire region of the top of the substrate W.

The spin chuck 51 is coupled to and rotated by a metallic rotary shaft 56 serving as a drive shaft of a rotation driving mechanism 55 including a motor and the like. The rotary shaft 56 is a hollow shaft, in which inserted a treatment liquid supply pipe 57 capable of supplying deionized water or a chemical. Connected to the upper end of the treatment liquid supply pipe 57 is a center shaft nozzle (fixed nozzle) 58 having a discharge port 58*a* at a position in the vicinity of the center of the underside of the substrate W held by the spin chuck 51. A treatment liquid (chemical or deionized water) can be supplied toward the center of the underside of the substrate W from the discharge port 58*a* of the center shaft nozzle 58. Because of a centrifugal force, the treatment liquid spreads to the entire region of the underside surface of the substrate W.

Provision is made such that deionized water or a chemical (e.g., an etching solution) is supplied at predetermined timings to the treatment liquid supply pipe 57 through a deionized water valve 61 connected to a deionized water source or through a chemical valve 62 connected to a chemical supply source.

The space between the inner wall of the rotary shaft 56 and the treatment liquid supply pipe 57 serves as a processing-gas feed passage 59, which communicates with the space below the substrate W around the center shaft nozzle 58. Provision is made such that a processing gas (e.g., inert gas such as nitrogen or the like) from a processing gas source is supplied to the processing-gas feed passage 59 through a processing-gas valve 63.

The processing cup 60 made of a resin material having a chemical resistance has a bottom wall 65 disposed under the spin chuck 51 and a plurality of (three in this embodiment) cylindrical partition walls 66, 67, 68 perpendicularly standing from the bottom wall 65. The cylindrical partition walls 66, 67, 68 are arranged coaxial with the rotary shaft 56. Formed between the inner and the intermediate cylindrical partition walls of 66, 67 is a drainage groove 69 for discharging the treatment liquid. A drainage pipe 70 is connected to the bottom face of the drainage groove 69. Formed between the intermediate and the outer cylindrical partition walls of 67, 68 is a collecting groove 77 for collecting the treatment liquid (mainly, chemical) for reuse. A collecting pipe 78 is connected to the bottom face of the collecting groove 77.

Disposed over the processing cup 60 around the spin chuck 51 is a splash guard 71 serving as a treatment liquid receiving member for receiving a treatment liquid which splashes out by a centrifugal force associated with the rotation of the spin chuck 51. The splash guard 71 is made of a resin material having a chemical resistance and an annular cylindrical member surrounding the spin chuck 51. In the upper inner wall surface of the splash guard 71 which is opposite to the spin chuck 51, a drainage receiving portion 72 (treatment liquid receiving face) having a transverse V shape section is formed over the splash guard 71. The drainage receiving portion 72 is connected to a drainage guiding portion 73 at the lower end thereof which hangs down toward the drainage groove 69. In the lower inner wall surface of the splash guard 71, a collected liquid receiving portion 75 is formed with a curved surface which is opened inward and downward. This collected liquid receiving portion 75 is arranged to guide the treatment liquid to the inside of the collecting groove 77.

The splash guard 71 is arranged vertically movable by a splash guard vertical movement driving mechanism 74. Accordingly, the splash guard 71 is vertically moved between a collecting position 71A shown by a two-dot chain line, a liquid discharging position 71B also shown by a two-dot chain line, and a retreat position 71C shown by a solid line, shown in FIG. 2. When the splash guard 71 is positioned at the collecting position 71A, the collected liquid receiving portion 75 faces to the peripheral end face of the substrate W held by the spin chuck 51, and receives the treatment liquid discharged outward from the substrate W and guides the treatment liquid thus received to the collecting groove 77. On the other hand, when the splash guard 71 is positioned at the liquid discharging position 71B, the drainage receiving portion 72 faces to the peripheral end face of the substrate W held by the spin chuck 51, and receives the treatment liquid discharged outward from the substrate W, whereby the treatment liquid thus received is guided from the drainage guiding portion 73 to the drainage groove 69. Further, when the splash guard 71 is positioned at the retreat position 71C, both the drainage receiving portion 72 and the collected liquid receiving portion 75 are retreated downward with respect to the substrate W held by the spin chuck 51, and the treatment liquid discharged from the substrate W passes over the splash guard 71, reaches the inner wall of a processing chamber (not shown) and is then discharged through a discharging passage (not shown).

Figure 3:
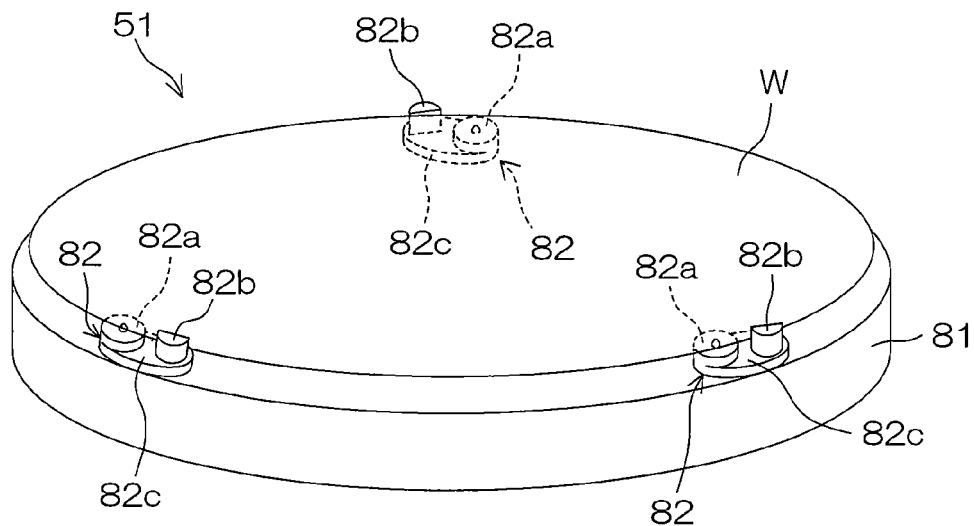
FIG. 3 is a schematic perspective view for illustrating the arrangement of a spin chuck in the substrate processing unit shown in FIG. 2.

As shown in FIG. 3, the spin chuck 51 has: a disk-like spin base 81 made of a resin material having a chemical resistance; holding pins 82 serving as substrate holding members disposed at a plurality of positions at spatial intervals (three positions at regular intervals in the embodiment shown in FIG. 3) at the peripheral edge of the top surface (the surface facing to the substrate) of the spin base 81; and a holding pin driving mechanism 83 (See FIG. 2) for driving the holding pins 82.

The holding pin driving mechanism 83 has, for example, link mechanisms 86 housed in a housing space 85 inside of the spin base 81, and a link driving mechanism 87 for driving the link mechanisms 86.

The link driving mechanism 87 has a rotary-side movable member 88 rotatable together with the rotary shaft 56, a stationary-side movable member 90 coupled to the outer periphery side of the rotary-side movable member 88 through a bearing 89, and a holding pin drive vertical driving mechanism 91 for vertically moving the stationary-side movable member 90.

When the stationary-side movable member 90 is vertically moved by the holding pin drive vertical driving mechanism 91, the rotary-side movable member 88 is vertically moved together with the stationary-side movable member 90. This vertical movement is transmitted to the link mechanisms 86 and then converted into an operation of the holding pins 82. Accordingly the holding pins 82 can be displaced between the holding position at which a substrate W is held, and the release position at which the substrate holding status is released. The stationary-side movable member 90 and the rotary-side movable member 88 are coupled to each other through the bearing 89. Accordingly, even though the spin chuck 51 is in rotation, the substrate W holding position can be changed by releasing or loosening holding the substrate by the holding pins 82.

Figure 4:
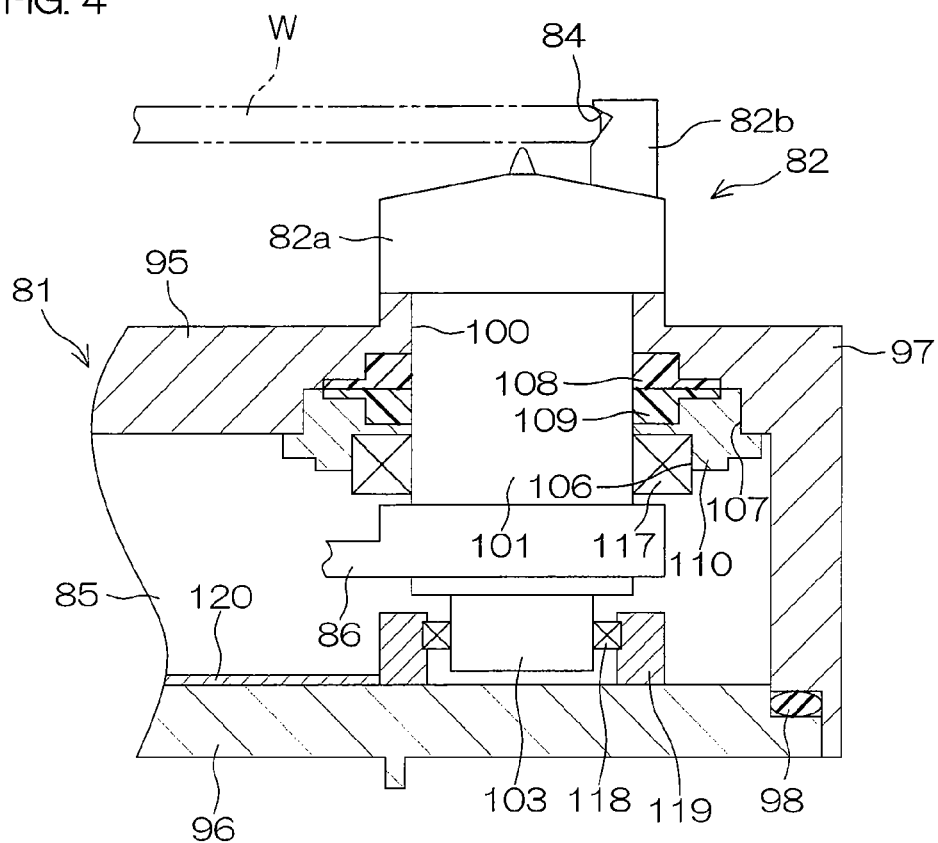
FIG. 4 is an enlarged section view of the arrangement in the vicinity of a holding pin of the spin chuck in FIG. 3.

FIG. 4 is an enlarged section view of the arrangement in the vicinity of a holding pin 82. Each holding pin 82 is a substrate contacting member coming in contact with a substrate W, and is made of a conductive resin material having a chemical resistance, for example, a conductive ETFE (tetrafluoroethylene-ethylene copolymer resin) or a conductive PTFE (polytetrafluoroethylene resin). Each holding pin 82 has: a supporting portion 82a which supports the underside of the peripheral edge of a substrate W; a holding portion 82b which laterally holds the peripheral end face of a substrate W; and a lever 82c (See FIG. 3) which connects the supporting portion 82a and the holding portion 82b. Each holding pin 82 is rotatable around a perpendicular axis at the center of the supporting portion 82a. Accordingly the holding portion 82b can be moved toward or away from the peripheral end face of a substrate W, whereby the holding portion 82b can be displaced to the holding position at which a substrate W is held, and the release position at which such substrate holding is released. The holding portion 82b has a substrate receiving portion 84 having a section of an inward-focused V shape corresponding to the peripheral end face of a substrate W. When the holding portion 82b is pushed against the peripheral end face of a substrate W, the substrate W is gradually pushed up in the substrate receiving portion 84, whereby the substrate W is listed up from the supporting portion 82a.

The spin base 81 has an upper plate portion 95 in a disk shape, a lower plate portion 96 in a disk shape, and a lateral plate portion 97 which joins the upper and lower plate portions 95, 96 to each other at the peripheral edges thereof, these plate portions 95, 96, 97 defining a housing space 85 inside thereof. In this embodiment, the upper plate portion 95 and the lateral plate portion 97 are made in a unitary structure, and the lateral plate portion 97 and the lower plate portion 96 are joined to each other through an O-ring 98. The lower plate portion 96 is connected to the upper end of the rotary shaft 56 of the rotation driving mechanism 55 at its inner edge by bolts 92 made of a metallic material such as a stainless steel (SUS) or the like.

In the peripheral edge of the upper plate portion 95a through-holes 100 penetrating in the perpendicular direction, in each of which a rotary shaft 101 is inserted made of a metallic material such as a stainless steel. The holding pins 82 are connected to the upper ends of the rotary shafts 101.

At the inner wall of the through-hole 100, sealing members 108, 109 are disposed between the inner wall and the rotary shaft 101. These sealing members 108, 109 are held by a seal retainer 110 press-fit into a seal retainer holding step portion 107. Further, a bearing 117 for rotatably supporting the rotary shaft 101 is press-fit into a bearing holding step portion 106 formed on the underside of the seal retainer 110.

On the other hand, the rotary shaft 101 has a lower end portion 103 having a smaller diameter. The lower end portion 103 is supported by a bearing 118, which is press-fit into a cylindrical bearing holding member 119 fixed to the inner surface (top surface) of the lower plate portion 96. The bearing holding member 119 is made of a metallic material such as aluminum or the like. The bearing holding member 119 is electrically connected to the bolt 92 through a metallic tape (e.g., an aluminum tape) 120 (See FIG. 2). The metallic tape 120 is disposed on the top surface of the lower plate portion 96 in the housing space 85 having one end connected to the bearing holding member 119 and the other end connected to the bolt 92.

The rotary shaft 101 is coupled to the link mechanism 86 at its intermediate portion. Accordingly, the rotary shaft 101 is arranged rotatable around its center axis by a driving force received from the link mechanism 86.

As mentioned earlier, the holding pins 82 are made of a conductive resin, and the rotary shafts 101 and the bearing holding members 119 are made of a metallic material. Accordingly, the holding pins 82 are electrically connected to the rotary shaft 56 of the rotation driving mechanism 55 through the grounding passage formed by the rotary shafts 101, the bearings 118, the bearing holding members 119, the metallic tapes 120 and the bolts 92. As shown in FIG. 2, the metallic rotary shaft 56 is electrically grounded. As a result, a substrate W held by the holding pins 82 is maintained as electrically grounded during the whole period of time when the substrate is being held. Therefore, the substrate W is never electrically induced and charged even though there is an electrically charged member around the substrate W.

The following description will give an outline of the processing executed on a substrate W in the substrate processing units 41-44.

First, the splash guard 71 is located in the retreat position 71C and an unprocessed substrate W is delivered to the spin chuck 51 by the main transfer robot 30. At this time, the holding pins 82 are set at the release position. When the substrate holding hands 31, 32 of the main transfer robot 30 are retreated, the holding pin drive vertical driving mechanism 91 is driven to set the holding pins 82 at the holding position. Then, the spin chuck 51 is rotationally driven around the axis of rotation 51a by the rotation driving mechanism 55.

Then, the chemical valves 54, 62 are opened to supply a chemical to the top and underside of the substrate W from the treatment liquid nozzle 52 and the center shaft nozzle 58, respectively. At this time, the splash guard 71 is disposed at the collecting position 71A. In such a way, a process with a chemical is executed on the top and underside of the substrate W, and the used chemical is collected for a reuse.

After execution of the process with the chemical for a predetermined period of time, the chemical valves 54, 62 are closed and the splash guard 71 is then switched to the liquid discharging position 71B (or the retreat position 71C) before the deionized water valves 53, 61 are opened. Then, a rinsing treatment with deionized water is executed onto the top and underside of the substrate W.

After execution of the deionized water rinsing treatment for a predetermined period of time, the deionized water valves 53, 61 are closed and the spin chuck 51 is rotated at a high speed (e.g., at 3000 rpm) to execute a drying process for shaking off the waterdrops on the top and underside of the substrate W. At this time, the splash guard 71 is set to the retreat position 71C.

After the drying process, the rotation of the spin chuck 51 is stopped, and the holding pin drive vertical driving mechanism 91 is operated to set the holding pins 82 to the release position. Thereafter, the substrate holding hands 31, 32 of the main transfer robot 30 carry out the processed substrate W from the substrate processing unit 41-44.

As mentioned earlier, the processing cup 60 and the splash guard 71, both made of a resin material, are susceptible to electrical charging. When an unprocessed substrate W is carried in the spin chuck 51 by the main transfer robot 30, or when a processed substrate W is carried out from the spin chuck 51, the substrate W passes in the vicinity of the electrically charged members. At this time of prior art, the substrate W is disadvantageously electrically induced and charged. In the arrangement according to the present embodiment, however, the substrate W held by the main transfer robot 30 is always electrically grounded, thus preventing the substrate W from being electrically induced and charged.

The holding pins 82 of the spin chuck 51 are electrically grounded. Accordingly, when a substrate W is delivered between the main transfer robot 30 and the spin chuck 51, no electrical discharge is produced, and when the splash guard 71 is vertically moved, the substrate W is not electrically induced and charged. It is further possible to restrain or prevent the occurrence of frictional charging due to the friction between the substrate W surface and the air when the substrate W is rotated at high speed by the spin chuck 51.

Further, since a substrate W is electrically grounded during the whole period of time when the substrate is held by the main transfer robot 30 and by the indexer robot 6, the substrate W during transfer is not electrically charged under the influence of the surrounding members. Obviously, electrical discharge is also prevented from being induced when the substrate W is delivered between the main transfer robot 30 and the indexer robot 6.

As thus discussed, a substrate W is maintained in an electrically grounded state during the whole period of time of the outward transfer stage from a carrier C to the spin chuck 51 through the indexer robot 6 and the main transfer robot 30, the holding stage during which the substrate W is being held by the spin chuck 51, and the homeward transfer stage from the spin chuck 51 to a carrier C through the main transfer robot 30 and the indexer robot 6. This restrains or prevents electrical discharge from being induced immediately before the treatment liquid supplied from a treatment liquid nozzle 52 reaches the surface of a substrate W. It is therefore also possible to restrain or prevent electrical discharge from being induced in either of the transfer stage and the holding stage. This restrains or prevents breakdown of the thin films or devices formed on a substrate W, thus achieving substrate processing of high quality.

In the foregoing, an embodiment of the present invention has been discussed, but the present invention may be embodied in any of other forms. For example, as shown in FIG. 1, there may be disposed a substrate contacting member 20 having conductive property which comes in contact with the substrates W in a carrier C, and the substrate contact member 20 may be grounded, so that the substrates W in the carrier C may be grounded through the substrate contacting member 20. According to the above-mentioned arrangement, a substrate W is maintained at grounding potential all the time when the substrate is present in the substrate processing apparatus, thereby further reducing the possibility of electrical discharge being induced.

Further, in the above-mentioned embodiment, the description has been made of an apparatus arranged to execute processing on a circular substrate W. However, the present invention may also be applied to an apparatus arranged to execute processing on a square substrate such as a liquid crystal display device substrate.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application No. 2006-55135 filed with the Japanese Patent Office on Mar. 1, 2006, the entire disclosure of which is incorporated herein by reference.

What we claim is:

1. A substrate processing apparatus comprising:
   a carrier holding unit for holding a carrier which houses a substrate;
   a substrate holding mechanism for holding a substrate at a time when a predetermined process is executed on a substrate; and
   a substrate transfer mechanism for transferring a substrate between the substrate holding mechanism and the carrier held by the carrier holding unit;
   the substrate holding mechanism having a first substrate contacting member which comes in contact with the substrate at a time when the substrate holding mechanism holds the substrate;
   at least a substrate contacting portion of the first substrate contacting member including a conductive portion, which is electrically grounded;
   the substrate transfer mechanism having a second substrate contacting member which comes in contact with the substrate at a time when the substrate transfer mechanism transfers the substrate; and
   at least a substrate contacting portion of the second substrate contacting member including a conductive portion, which is electrically grounded.

2. A substrate processing apparatus according to claim 1, wherein
   the substrate transfer mechanism comprises a first transfer mechanism for carrying a substrate in and/or out from the carrier held by the carrier holding unit, and a second transfer mechanism for transferring a substrate between the first transfer mechanism and the substrate holding mechanism; and
   each of the first and second transfer mechanisms has the second substrate contacting member which comes in contact with the substrate at a time when each of the first and second transfer mechanisms holds the substrate.

3. A substrate processing apparatus according to claim 1, further comprising a third substrate contacting member which comes in contact with the substrates housed in the carrier held by the carrier holding unit, at least a substrate contacting portion of the third substrate contacting member including a conductive portion, which is electrically grounded.

4. A substrate handling method comprising:
   a step of making a carrier which houses a substrate held by a carrier holding unit;
   a substrate holding step of holding a substrate by a substrate holding mechanism at a time when a predetermined process is executed on the substrate;
   a substrate transfer step of transferring a substrate between the substrate holding mechanism and the carrier held by the carrier holding unit; and
   a charging restraining step of contacting an electrically grounded conductive member with the substrate during the whole period of time of the substrate holding step and the substrate transfer step, thereby to restrain the substrate from being electrically charged.

5. A substrate handling method according to claim 4, wherein the charging restraining step includes a step of contacting an electrically grounded conductive portion with the substrates in the carrier held by the carrier holding unit.

* * * * *